(12) United States Patent
Germagian

(10) Patent No.: US 9,681,587 B2
(45) Date of Patent: Jun. 13, 2017

(54) SYSTEM AND METHOD FOR COOLING ELECTRONIC EQUIPMENT

(75) Inventor: Mark Germagian, Hubbardston, MA (US)

(73) Assignee: PCE, Inc., Lincoln, NE (US)

( * ) Notice: Subject to any disclaimer, the term of this patent is extended or adjusted under 35 U.S.C. 154(b) by 399 days.

(21) Appl. No.: 11/897,304

(22) Filed: Aug. 30, 2007

(65) Prior Publication Data

US 2009/0056359 A1    Mar. 5, 2009

(51) Int. Cl.
*F25D 23/12*    (2006.01)
*H05K 7/20*    (2006.01)

(52) U.S. Cl.
CPC ..... *H05K 7/20745* (2013.01); *H05K 7/20836* (2013.01)

(58) Field of Classification Search
CPC .............. H05K 7/20745; H05K 7/20836
USPC .......... 454/184; 361/690, 695, 687; 62/259.2
See application file for complete search history.

(56) References Cited

U.S. PATENT DOCUMENTS

| | | | |
|---|---|---|---|
| 4,261,256 A | 4/1981 | Joret | |
| 5,168,424 A | 12/1992 | Bolton et al. | |
| 5,484,012 A | 1/1996 | Hiratsuka | |
| 5,831,525 A * | 11/1998 | Harvey | 340/507 |
| 6,034,873 A | 3/2000 | Stahl et al. | |
| 6,101,459 A | 8/2000 | Tavallaei et al. | |
| 6,104,003 A | 8/2000 | Jones | |
| 6,127,663 A | 10/2000 | Jones | |
| 6,247,898 B1 | 6/2001 | Henderson et al. | |
| 6,268,664 B1 * | 7/2001 | Rolls et al. | 307/32 |
| 6,368,064 B1 | 4/2002 | Bendikas et al. | |
| 6,398,505 B1 * | 6/2002 | Sekiguchi | 417/2 |
| 6,473,668 B2 * | 10/2002 | Abuzeid et al. | 700/121 |
| 6,504,338 B1 | 1/2003 | Eichorn | |
| 6,537,019 B1 | 3/2003 | Dent | |
| 6,539,736 B1 | 4/2003 | Isazawa et al. | |
| 6,545,438 B1 | 4/2003 | Mays, II | |
| 6,557,357 B2 | 5/2003 | Spinazzola et al. | |
| 6,639,794 B2 | 10/2003 | Olarig et al. | |
| 6,694,759 B1 | 2/2004 | Bash et al. | |
| 6,722,151 B2 | 4/2004 | Spinazzola et al. | |
| 6,725,132 B2 | 4/2004 | Frankel et al. | |
| 6,776,707 B2 * | 8/2004 | Koplin | 454/184 |
| 6,931,306 B2 * | 8/2005 | Frankel et al. | 700/300 |
| 6,932,696 B2 | 8/2005 | Schwartz et al. | |
| 6,954,684 B2 * | 10/2005 | Frankel et al. | 700/300 |
| 7,137,775 B2 | 11/2006 | Hopkins | |
| 7,167,993 B1 | 1/2007 | Thomas et al. | |
| 7,173,820 B2 | 2/2007 | Fink et al. | |
| 7,179,046 B2 | 2/2007 | Hopkins | |
| 7,228,204 B2 | 6/2007 | Iino et al. | |

(Continued)

*Primary Examiner* — Gregory Huson
*Assistant Examiner* — Dana Tighe
(74) *Attorney, Agent, or Firm* — Suiter Swantz pc llo

(57) ABSTRACT

A cooling system and method in accordance with the principles of the present invention employs a fan cartridge that includes a fan and a fan controller and is configured for mounting within an electronics cabinet's warm air return path in a data center cooling system. The fan cartridge may also include a display panel which may be used to convey operational information relative to the fan cartridge. A plurality of such fan cartridges may be mounted within the electronic cabinet's warm air return path to provide redundant air flow supply for the associated electronics cabinet.

8 Claims, 6 Drawing Sheets

(56) References Cited

U.S. PATENT DOCUMENTS

| | | |
|---|---|---|
| 7,330,350 B2 | 2/2008 | Hellriegel et al. |
| 7,447,022 B2 | 11/2008 | Murakami et al. |
| 7,527,468 B2 | 5/2009 | Hopkins |
| 7,604,535 B2 | 10/2009 | Germagian et al. |
| 8,223,495 B1 | 7/2012 | Carlson et al. |
| 8,553,416 B1 | 10/2013 | Carlson et al. |
| 2002/0015287 A1 | 2/2002 | Shao |
| 2004/0164171 A1 | 8/2004 | Eisenhour |
| 2004/0185770 A1 | 9/2004 | Soeholm et al. |
| 2004/0190246 A1 | 9/2004 | Arbogast et al. |
| 2004/0196631 A1 | 10/2004 | Ueda et al. |
| 2004/0228087 A1* | 11/2004 | Coglitore .............. 361/687 |
| 2004/0243280 A1 | 12/2004 | Bash et al. |
| 2004/0257766 A1 | 12/2004 | Rasmussen et al. |
| 2005/0209740 A1 | 9/2005 | Vann, Jr. |
| 2005/0225936 A1 | 10/2005 | Day |
| 2005/0238421 A1* | 10/2005 | Doerr et al. ............ 403/322.4 |
| 2005/0270738 A1 | 12/2005 | Hellriegel et al. |
| 2006/0108962 A1 | 5/2006 | Murray et al. |
| 2006/0111816 A1 | 5/2006 | Spalink et al. |
| 2006/0139877 A1 | 6/2006 | Germagian et al. |
| 2006/0168975 A1 | 8/2006 | Malone et al. |
| 2006/0227505 A1 | 10/2006 | Miyamoto et al. |
| 2006/0260338 A1 | 11/2006 | VanGilder et al. |
| 2006/0272342 A1 | 12/2006 | Bash et al. |
| 2007/0080653 A1 | 4/2007 | Wei et al. |
| 2007/0097636 A1 | 5/2007 | Johnson et al. |
| 2007/0099747 A1 | 5/2007 | Ando et al. |
| 2007/0129000 A1 | 6/2007 | Rasmussen et al. |
| 2007/0146994 A1 | 6/2007 | Germagian et al. |
| 2007/0204637 A1 | 9/2007 | Fujii et al. |
| 2007/0213000 A1 | 9/2007 | Day |
| 2007/0254583 A1 | 11/2007 | Germagian et al. |
| 2007/0281639 A1 | 12/2007 | Clidaras et al. |
| 2008/0055848 A1 | 3/2008 | Hamburgen et al. |
| 2008/0055850 A1 | 3/2008 | Carlson et al. |
| 2008/0104985 A1 | 5/2008 | Carlsen |
| 2008/0105412 A1 | 5/2008 | Carlsen et al. |
| 2009/0173473 A1 | 7/2009 | Day |
| 2009/0296342 A1 | 12/2009 | Matteson et al. |
| 2010/0015906 A1 | 1/2010 | Takahashi et al. |
| 2010/0139908 A1 | 6/2010 | Slessman |
| 2010/0216388 A1 | 8/2010 | Tresh et al. |
| 2010/0248609 A1 | 9/2010 | Tresh et al. |
| 2010/0312415 A1 | 12/2010 | Loucks |
| 2011/0045759 A1 | 2/2011 | Rasmussen et al. |
| 2011/0082592 A1 | 4/2011 | Saito et al. |
| 2011/0094714 A1 | 4/2011 | Day |
| 2011/0105010 A1 | 5/2011 | Day |
| 2011/0127027 A1 | 6/2011 | Kashirajima et al. |
| 2011/0128699 A1 | 6/2011 | Heydari et al. |
| 2011/0146651 A1 | 6/2011 | Puranen et al. |
| 2011/0207391 A1 | 8/2011 | Hamburgen et al. |
| 2011/0238236 A1 | 9/2011 | Tozer et al. |
| 2012/0014060 A1 | 1/2012 | Slessman |
| 2012/0014061 A1 | 1/2012 | Slessman |
| 2012/0041600 A1 | 2/2012 | Michael et al. |
| 2012/0167610 A1 | 7/2012 | Dunnavant |
| 2012/0171943 A1 | 7/2012 | Dunnavant |
| 2012/0181001 A1 | 7/2012 | Marsh et al. |
| 2012/0303164 A1 | 11/2012 | Smith et al. |
| 2012/0329378 A1 | 12/2012 | Lucia et al. |
| 2013/0138253 A1 | 5/2013 | Chainer et al. |
| 2013/0265064 A1 | 10/2013 | Hamann et al. |
| 2014/0037462 A1 | 2/2014 | Mashak et al. |
| 2014/0078668 A1 | 3/2014 | Goulden et al. |
| 2014/0141707 A1 | 5/2014 | Carlson et al. |

* cited by examiner

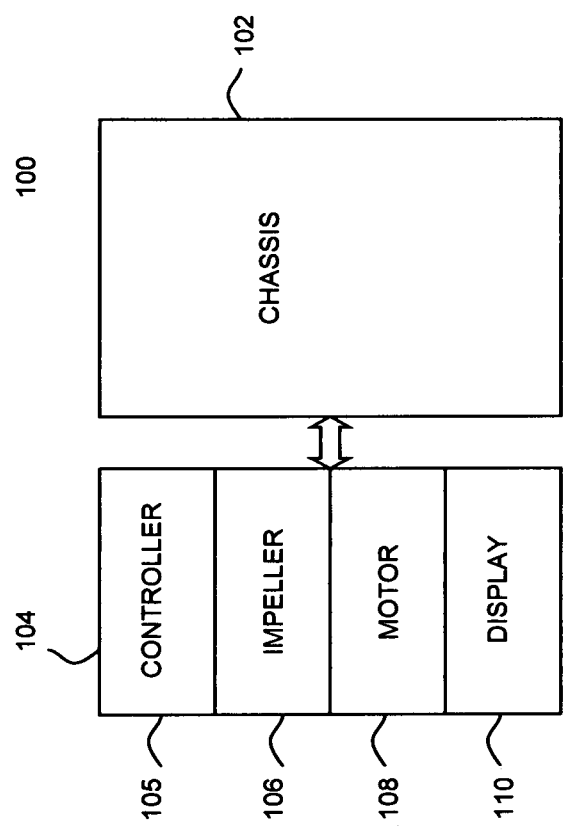

SYSTEM AND METHOD FOR COOLING ELECTRONIC EQUIPMENT

RELATED APPLICATIONS

Not applicable

FIELD OF THE INVENTION

The invention relates to electronic cooling systems and more particularly to systems and methods for cooling an enclosed rack of electronic equipment such as may be found in a server farm, for example.

BACKGROUND OF THE INVENTION

Large information handling system installations, such as data centers, server farms, and telecommunications switching systems (all referred to hereinafter generically as "data centers") generate a great deal of waste heat that must be dissipated in order for the systems to continue operation. The capacity of such data centers continues to grow at a rapid pace to meet the demands of an increasingly "wired" society. Not only are such installations steadily increasing in computing capacity and overall volume, their power density is also increasing. Greater size and density, naturally, leads to greater or improved cooling requirements.

Conventional data center cooling systems typically include a cool air supply provided by air conditioning systems. Cool air from the air conditioner is routed through a plenum formed by a raised floor upon which data center cabinet-enclosed rack-mounted computing or switching components rest. Cool air passes from the plenum into the cabinets and, as much as possible, through the components that require cooling for a forced convective flow of heat away from the components. The air heated by the components is then supposed to return to the air conditioner to be cooled and re-circulated through the raised floor plenum and through the electronic components in need of cooling. Some systems are more effective than others. For example, in many installations air warmed by the components finds its way back to the components before returning to be cooled by the air conditioning system. In this way, cooling air is mixed with air warmed by the components. This mixture of warm and cool air is much less effective at cooling the components. In fact, some estimates indicate that as much as 70% of cool air generated in a data center does not make contact with the equipment to be cooled. In this way, a great deal of the energy is wasted by producing cooling air that isn't utilized effectively.

One way to improve the efficiency of data center cooling systems is to provide a system whereby cool air is supplied to equipment cabinets through a relatively closed system, such as a plenum formed by a raised floor, and the resultant, heated air, is returned to the air conditioner through ductwork either directly or through another plenum formed by a dropped ceiling. Although such a configuration provides improved efficiency compared to more conventional "open return" systems, such a system, in itself, does not address all the requirements for a modern data center cooling system. For example, one or more fans may be required to propel the heated, "waste air" back through a return duct and return plenum formed by the dropped ceiling to the air conditioning unit. The location, control, and maintenance of such fans has been approached in a somewhat haphazard fashion in some systems. A system and method that provides for efficient operation, ready maintenance and monitoring would therefore be highly desirable.

SUMMARY

A cooling system and method in accordance with the principles of the present invention includes a fan cartridge configured for mounting within a return air path that returns warmed air to a data center's air conditioner. Such a fan cartridge may be mounted within a chassis that is affixed to the structure providing the return air path. Each fan cartridge includes a fan, a fan controller, and a display configured to be viewed by a user positioned on the floor proximate the electronics cabinet for which the fan cartridge is providing air movement. The fan controller is configured to permit such a fan cartridge to operate independently, with all control functions, power, and communications positioned within the return air path.

In accordance with the principles of the present invention, a plurality of fan cartridges may be mounted in a single chassis, thereby providing redundant air movement for a given duct/cabinet combination. In an illustrative embodiment, each of the redundant fan cartridges is configured to communicate with the other and to thereby regulate its operational speed to meet that of the other fan cartridge. Each of the cartridges may also be configured to adjust to increase its output should the other cartridge fail.

In an illustrative embodiment each fan cartridge includes a self test function whereby a self test may be initiated from a front panel or through a network interface, for example. When initiated, the self-test reduces the fan function by a predetermined amount, which may be set at a factory or set by a user through a front panel, or network interface, for example. Similarly, the duration of the self test may set at the factory (e.g. for 30 sec., 1 min, or 5 min, for example) or by a user. While operating at a diminished level (anywhere from 0% to 100%) during the self test a fan controller in accordance with the present invention monitors the speed of the other fan(s) in a cartridge, various temperature readings in the associated cabinet and in the fan cartridge, various pressures within the cabinet and fan cartridge, and, where available, temperatures of individual components within the cabinet which, in an illustrative embodiment, are available through a network interface.

BRIEF DESCRIPTION OF THE DRAWINGS

The above and further features, aspects, and advantages of the invention will be apparent to those skilled in the art from the following detailed description, taken together with the accompanying drawings in which:

FIG. 1 is a conceptual block diagram of a fan cartridge in accordance with the principles of the present invention;

DETAILED DESCRIPTION

Figure 2A:
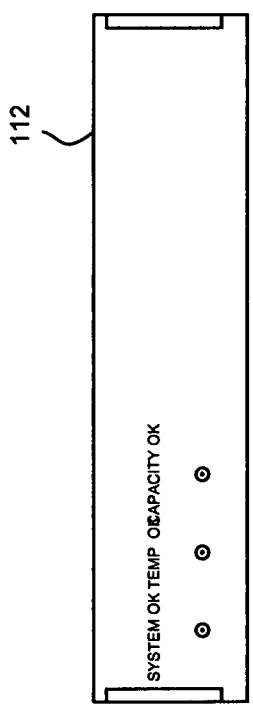
FIGS. 2A, 2B, and 2C are front plan views of display panels such as may be employed by a fan cartridge in accordance with the principles of the present invention.

In the conceptual block diagram of FIG. 1 a return air path fan 100 in accordance with the principles of the present invention includes a chassis 102 configured for mounting within a cooling system, such as a warm air return path that may be employed within a data center cooling system. The chassis 102 provides support for a fan cartridge 104. The chassis 102 and fan cartridge 104 may be configured for convenient insertion in and withdrawal from such a return air path. The cartridge 104 may be guided and supported, for example, by guide rails that direct the cartridge 104 to a fully engaged position within the duct. The guide rails may, for example, be included in a chassis such as discussed in greater detail in the discussion related to FIG. 5. In the fully engaged position, a mechanism with the fan cartridge 104 may, for example, be engaged with a mating mechanism within the chassis to provide power to the fan cartridge 104. Mating "male" and "female" plug ends or card edge and slot mechanisms could be used for such purposes, for example. A locking mechanism, such as a simple hook for example, may be employed to secure the cartridge 104 within the chassis 102 in the engaged position. In an illustrative embodiment, the cartridge 104 includes an impeller 106, a motor 108, a controller 105, and a display 110. The motor 108 receives power through the connection between the chassis 102 and the fan cartridge 104 to provide motive force to rotate the impeller 106 and to thereby circulate cooling air (re-circulate warmed cooling air) to thereby return air to a data center's air conditioning system.

The display 110 may be implemented using any electronics technology, including light emitting diode (LED), liquid crystal display (LCD), polymer light emitting diode (PLED), plasma, cathode ray tube (CRT), liquid crystal on silicon (LCOS), organic light emitting diode (OLED), high temperature polysilicon (HTPS), active matrix OLED, surface conductive electron emitting display (SED), or digital light projection display (DLP), for example. The display 110 may vary widely in scope, from a simple single-LED status light to a plurality of display components, each of which may be highly complex and capable of displaying complex graphical and alphanumeric information.

In an illustrative embodiment, the display 110 may positioned within the cartridge 102 to facilitate reading. For example, the display 110 may be located at the front of the cartridge 104 with a panel positioned at an angle to the corresponding vertical surface of the return air path within which the cartridge 104 is mounted. The angle between the display panel and the corresponding duct surface may be chosen to provide easy viewing by an individual located on the floor below the duct in which the cartridge 104 is mounted, by angling the display panel downward, for example. The display panel may be fixed at a predetermined angle (including flush) with the corresponding vertical surface, or the panel may be adjustable to accommodate various duct locations and configurations.

The front plan view of FIG. 2A illustrates the components of a relatively simple fan cartridge display front panel 112 in accordance with the principles of the present invention. In this illustrative embodiment, the display panel includes three indicator lights, which may be implemented with LEDs, for example. The indicator lights are labeled: "SYSTEM OK," TEMPERATURE OK," and "CAPACITY OK." Each of the indicator lights may change color to indicate a different status. For example, the TEMP OK light being green may indicate that the temperature within the duct or within an equipment cabinet to which the duct is attached is at an acceptable level, while red may indicate that the temperature is too high. Blinking or flashing of any or all of the lights may provide another indication, such as an alarm condition, for example. As previously noted, the panel 112 may be fixed at any of a variety of angles with respect to the corresponding duct wall, or it may be adjustable to hold any of a variety of angles relative to the corresponding duct wall.

Figure 2B:
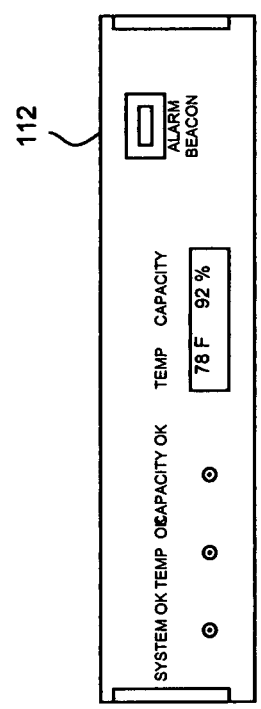

The front plan view of FIG. 2B illustrates the components of a more complex fan cartridge display panel in accordance with the principles of the present invention. In this illustrative embodiment three indicator lights (SYSTEM OK, TEMP(ERATURE) OK, and CAPACITY OK) are accompanied by alphanumeric displays that indicate INLET TEMPERATURE and CAPACITY UTILIZATION. In this illustrative embodiment the inlet temperature display toggles between Centigrade and Fahrenheit indications of the temperature at the inlet of a cabinet associated with the duct. The capacity utilization display provides an indication of the percentage of the total capacity of the airflow. Such an indication may be used for planning and new electronic equipment deployment decisions. The ALARM BEACON indicator may be used as an indicator of any of a variety of alarm conditions, such as excessive temperatures within an associated cabinet, for example.

Figure 2C:
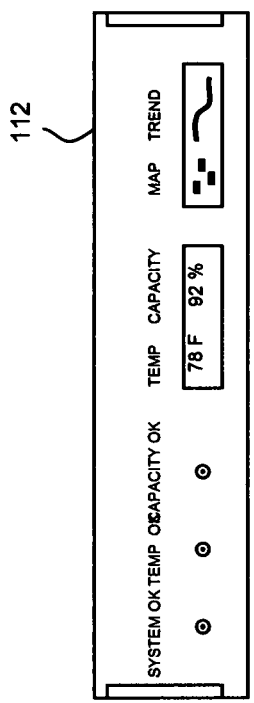
Figure 2D:
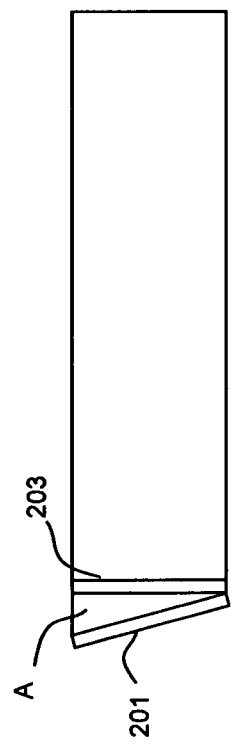
FIG. 2D is a side view of a front panel display in accordance with the principles of the present invention.

The front plan view of FIG. 2C illustrates the components of a somewhat more complex display panel such as may be used with a fan cartridge in accordance with the principles of the present invention. This panel includes the SYSTEM OK, TEMP OK, CAPACITY OK, INLET TEMPERATURE, and CAPACITY UTILIZATION displays, as previously described. Additionally, two graphical displays labeled MAP and TREND are used to display, respectively, a heat map of the interior of the associated cabinet and a graph that indicates temperature and/or pressure trends within the cabinets. The heat maps may be formed by infrared imagers within each shelf of a cabinet, with the images shifting through the various shelves and graphical trend displays changing in a coordinated fashion to thereby display the trend of a shelf parameter at the same time the MAP display provides a thermal image of the same shelf. The side view of FIG. 2D illustrates the positioning of a front panel display in accordance with the principles of the present invention. In this illustrative embodiment, the front panel 201 is attached to a front plate 203 which forms the front wall of a fan cartridge in accordance with the principles of the present invention. The front panel 201 houses display elements such as those depicted in FIGS. 2A-2C. The front panel 201 is configured to adjust through an angle "A" to thereby enhance the display's viewability.

Figure 3:
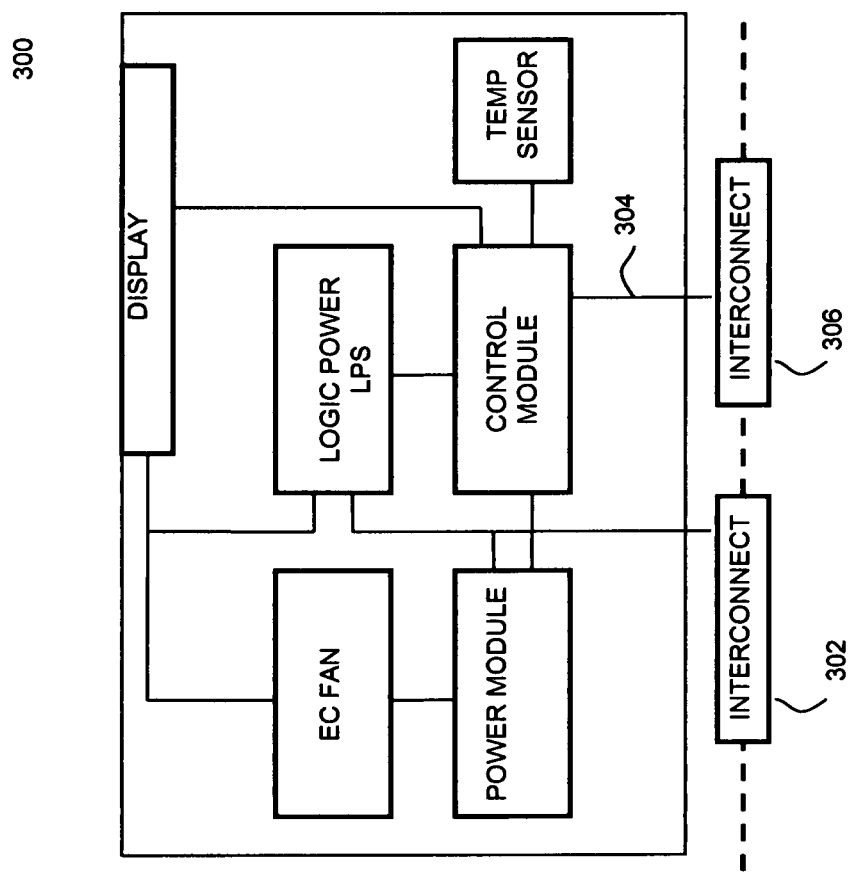
FIG. 3 is a more detailed conceptual block diagram of a fan cartridge in accordance with the principles of the present invention.

The block diagram of FIG. 3 illustrates the components of a fan cartridge 300 in accordance with the principles of the present invention. In this illustrative embodiment power is supplied through a backplane connection 302 and distributed throughout the cartridge 300 by the logic power supply, labeled LPS, to a electronically commutated fan, labeled EC Fan, to a power electronics module having the same label, to a display module, so labeled, and to a control module and temperature sensor, both labeled as such. The EC fan includes both motor and impeller. In this illustrative embodiment the control module includes communications facilities configured for communications with components residing outside the fan cartridge 300 through links 304 connected through backplane connection 306. The control module controls operation of the fan through operation of the power electronics module. As is known in the art, the display may include control and interface electronics that off-load from the control module a portion of the burden associated with formatting and displaying information on the display. Typically, as the display becomes more complex, so too do the control electronics embedded within the display.

In an illustrative embodiment, the control module controls the speed of the fan based on the pressure measured within the electronics cabinet or the airflow in or out of the electronics cabinet associated with the duct in which the fan cartridge 300 resides. Such pressure/flow measurements may be communicated to the control module through the links 304, for example. The control module also reports the speed of the fan to the display, which may display the speed as a percentage of capacity, as indicated in FIGS. 2B and 2C and may report, through the links 304, such information as the fan speed and temperature to other equipment within the data center. Such information may be reported, for example, to a central controller within the data center or outside the data center. This information may be formatted in such a way as to permit ready integration with building management system (BMS) software and/or information technology (IT) management software.

Figure 4:
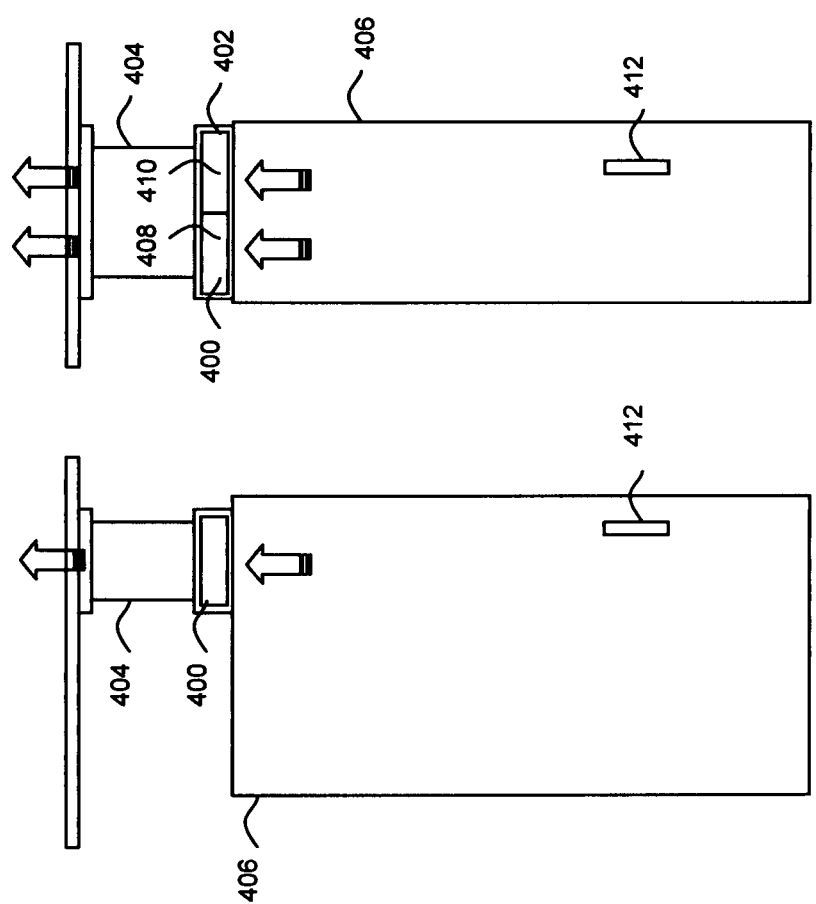
FIGS. 4A and 4B are side and front plan views of equipment cabinets, return air paths, and fan cartridges in accordance with the principles of the present invention, illustrating the placement of such cartridges relative to the equipment cabinet.

In accordance with the principles of the present invention, the pressure/flow sensor may employ either a pressure transducer or flow sensor and, as described in the discussion related to FIG. 4, the sensor may be located within the cabinet from which the fan cartridge returns warmed air to the data center air conditioner. The sensor may be configured to allow the fan within the cartridge 300 to operate at a predetermined speed in the event that the sensor fails or is not detected by the control module.

In an illustrative embodiment each fan cartridge includes a self test function whereby a self test may be initiated from a front panel or through a network interface, for example. When initiated, the self-test reduces the fan function by a predetermined amount, which may be set at a factory or set by a user through a front panel, or network interface, for example. Similarly, the duration of the self test may set at the factory (e.g. for 30 sec., 1 min, or 5 min, for example) or by a user. While operating at a diminished level (anywhere from 0% to 100%) during the self test a fan controller in accordance with the present invention monitors the speed of the other fan(s) in a cartridge, various temperature readings in the associated cabinet and in the fan cartridge, various pressures within the cabinet and fan cartridge, and, where available, temperatures of individual components within the cabinet which, in an illustrative embodiment, are available through a network interface. Readings acquired during the self test may be stored locally and analyzed by the individual fan controller or forwarded. Such results may be available locally through a front panel interface or they may be forwarded to a central monitor through a network interface, for example.

The side and front plan views, respectively, of FIGS. 4A and 4B illustrate the location of fan cartridges in accordance with the principles of the present invention within a return air path that returns air from an electronics cabinet to a data center's air conditioner. More particularly, in FIG. 4A fan cartridge 400 and fan cartridge 402 (not seen in 4A) are positioned within a return air path 404 atop an equipment cabinet 406. The return air path 404 conveys heated air from the cabinet 406 through a return plenum, a part of which is labeled 407 to a data center's air conditioner (not shown). The return air path includes a region within the cabinet 406 proximate to a duct 405 that also forms a part of the return air path. A cartridge 400 in accordance with the principles of the present invention may be positioned anywhere along this return air path: inside the cabinet 406 proximate a duct 405, anywhere within the duct 405, or within the return air plenum 407.

In this illustrative embodiment a plurality of fan cartridges are supported by a chassis and positioned within the return air path 404. Each fan cartridge 402, 400 have associated with it a front display panel 408, 410. The display panels 408, 410 are as previously described in the discussion related to FIGS. 2A, 2B, and 2C. A sensor module 412 includes one or more pressure/flow sensors, as previously described. The output of the pressure/flow sensor is directed to each of the fan cartridges 400 and 402 and utilized, as previously described, to control the speed of the fan within each cartridge. Although this illustrative embodiment includes two fan cartridges, embodiments with only one, or greater than two fan cartridges are contemplated within the scope of the present invention.

Figure 5:
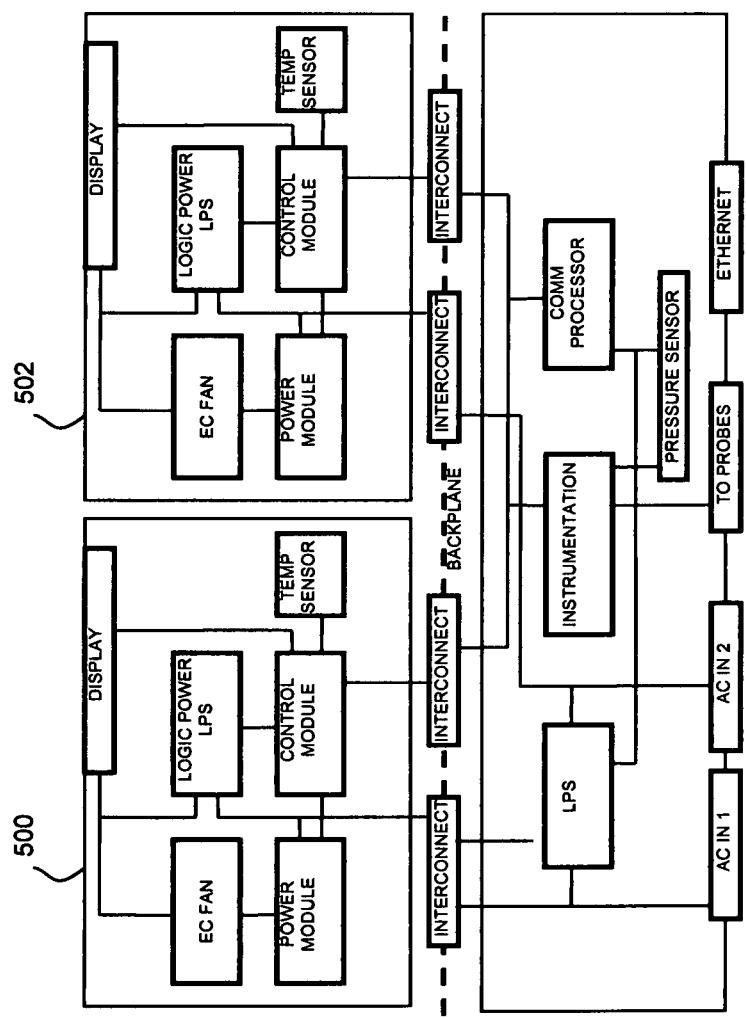
FIG. 5 is a conceptual block diagram of a redundant fan cartridge system, along with a corresponding fan cartridge chassis.

The block diagram of FIG. 5 illustrates the three components of a two-fan-cartridge implementation of a duct-mounted fan in system in accordance with the principles of the present invention. Each of the fan cartridges 500, 502 and chassis 504 are as described in the discussion related to FIG. 3. The chassis 504, in addition to providing support for the fan cartridges 500, 502 within a duct, includes a backplane, labeled Backplane, that provides for electrical communication of power and signals among the chassis 504 and fan cartridges 500, 502. The chassis 504 accepts redundant AC power through connectors labeled AC In 1 and AC In 2. This power is routed to logic power supplies, labeled LPS, within both fan cartridges and the chassis. A connector, labeled "To probes", within the chassis 504 routes signals between an instrumentation logic block, labeled "Instrumentation" and externally mounted probes, such a temperature, humidity, or smoke detection probes. Sensor data from the probes may be transmitted in analog or digital form to the instrumentation block, where the signals, in this illustrative embodiment, are conditioned before being applied to the control modules. Signal conditioning could include active or passive filtering, conversion from analog to digital form, level translation, or voltage-to-frequency conversion. A pressure sensor, labeled as such, provides analog or digitized readings of the rack plenum pressure to the instrumentation block. A logic power supply, labeled LPS, provides conditioned power to the instrumentation, pressure sensor, and communication processor blocks.

Various of the logic blocks, including each fan cartridge's control module, the chassis' Instrumentation block, and the communications processor may be implemented in a variety of technologies, including, but not limited to: discrete logic, state logic, microprocessors, microcontrollers, or field programmable gate arrays (FPGAs), for example. The chassis' communication processor is configured to communicate information from each of the fan cartridges 500, 502 to the other fan cartridge 502, 500 and, in this illustrative embodiment, through an Ethernet connection to other elements of the data center, such as IT and BMS systems, for example. In an illustrative embodiment a minimal configuration of an intelligent fan cartridge includes a fan and a variable power supply configured to operate the fan in response to signals indicative of the pressure flow in or out of the cabinet being cooled.

In an illustrative embodiment of a multi-fan-cartridge system in accordance with the principles of the present invention, each fan cartridge communicates with the other fan cartridges in a chassis co-located in a given warm air return path. Although, in the illustrative embodiment of FIG. 5, the communications are routed through a backplane and communications processor, the communications could be through a direct link among fan cartridges. Such communications among fan cartridges may be used to coordinate the operation of each fan within the return air path. For example, although each fan cartridge may be capable of operating, adjusting to operational variables such as temperature and pressure differences, and reporting status information independently, when operating together normally, the fan cartridges communicate with one another and coordinate their operations so that they balance to the same operating point. That is, in normal operation, each fan cartridge in a multi-cartridge cooling system chassis will control its fan so that it operates at the substantially the same speed as the other fan(s) within the cooling system. In this illustrative embodiment, other control parameters, such as pressure and inlet temperature will be taken into account at the same time so that each fan settles at the same operational point (that is, fan speed), that provides a predetermined level of air movement. In accordance with the principles of the present invention, that predetermined level of air movement may be reflected in the readings of the pressure/flow sensor.

The sensor may be baffled to shield it from a specific air stream such as that from another fan source within the enclosure, for example. Pressure reading or readings in the rear of the electronics cabinet can be taken with a pressure transducer or by measuring airflow in or out of the enclosure. When maintaining substantially a zero pressure in the enclosure with respect to the outside of the enclosure, the enclosure cooling system is then removing the same volume of air that the electronic equipment fans are placing into the enclosure. When the two operate in concert, the air flow of the equipment and the airflow of the fan cartridge or cartridges are matched, no more or no less air is being moved from the enclosure. Maintaining substantially a zero differential pressure will require the fan cartridge to speed up and speed down to accommodate the electronic equipment changes in airflow rates, a two-cartridge embodiment in accordance with the principles of the present invention, the fans are sized so that, at peak operating level, each fan may provide sufficient airflow for safe operation for a predetermined period of time should one fan fail. The predetermined period, and resultant fan size, may be chosen on an empirical basis. In an illustrative embodiment a cabinet, with approximately 20 kW of electronic equipment heat load, the electronic equipment can move approximately 1600 to 2800 CFM (cubic feet per minute), depending on equipment manufacturer or operating environment, of air into the electronics cabinet. In this illustrative embodiment the fan cartridge would be sized to remove the heated air to a hot air return path. Two 48 VDC 105 Watt fan cartridges could be employed for such a task.

The speed of each fan may be adjusted by its respective control module to anywhere from 0% to 100% of its rated maximum speed. In an illustrative embodiment, each module includes factory default settings which allow the fan to start at 100% fan speed and reduce speed to the necessary operating level for a zero differential pressure. Additional factory settings for alarm conditions would be to send an alarm when the fan speed has increased and exceeded 90% capacity. This is an indication that the fan is near maximum capacity. This factory default setting can be changed in service or turned off.

In an illustrative embodiment each fan starts at 100% of capacity when "powered up" or "plugged in" to a chassis, then reduces its speed to the point at which air flow requirements are met, as indicated by pressure readings within the cabinet. In this illustrative embodiment, each fan cartridge will set an alarm, which is displayed on the cartridge's front panel and also communicated to IT and BMS management systems when the fan speed reaches an alarm trigger point. The fan speed alarm trigger point may be adjusted. In an illustrated embodiment, the default fan speed alarm trigger point, set at the factory, is 90% of full speed. In this illustrative embodiment, each of the fan cartridges tracks its total hours of operation and reports that total in order to permit the swapping out of a fan at a time when it's likelihood of failure has risen to a predetermined threshold level. Such reporting allows system administrators to substantially avoid the failure and concomitant emergency swapping of fan cartridges.

The communications processor within each chassis is configured to provide graphs and real-time data, as well as email alerts at user-specified thresholds and to format fan speed data in order to export the data in a variety of files, such as CSV or Excel files, for example. Remote monitoring of operational and environmental information may be provided through a connection on the chassis. The communications processor may support a variety of network and data protocols, such as HTTP, TCP/IP, SNMP, and Modbus, for example.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. An apparatus for cooling an electronic equipment enclosure that includes a return air path for warm electronics exhaust air, comprising:

an electronic equipment enclosure, the electronic equipment enclosure including a first side;

a first cartridge, said first cartridge removably insertable within said first side of said electronic equipment enclosure, said first cartridge configured to be supported within said electronic equipment enclosure via a plurality of guides and secured within said electronic equipment enclosure, said first cartridge configured to move air in a vertical return air path along an interior surface of said first side of said electronic equipment enclosure, said first cartridge including:

a first fan;

a first fan controller; and a first display, wherein the first fan, the first fan controller and the first display are configured to receive electrical power when said first cartridge is inserted within said electronic equipment enclosure, said first display being placed on a front side of said first cartridge corresponding with the first side of the electronic equipment enclosure and said first fan is configured to move air in the vertical return air path along the interior surface of the first side of the electronic equipment enclosure; and a second cartridge, said second cartridge removably insertable within said electronic equipment enclosure, said second cartridge configured to be supported within said electronic equipment enclosure via a plurality of guides and secured within said electronic equipment enclosure, said second cartridge configured to move air in the vertical return air path along the interior surface of the first side of said electronic equipment enclosure, said second cartridge including:

a second fan;

a second fan controller; and a second display, wherein the second fan, the second fan controller and the second display are configured to receive electrical power when said second cartridge is inserted within said electronic equipment enclosure, said second display being placed on a front side of said second cartridge corresponding with the first side of the electronic equipment enclosure and said second fan is configured to move air in the vertical return air path along the interior surface of the electronic equipment enclosure, said first fan controller and said second fan controller are configured to receive one or more pressure readings and to determine a speed of a respective fan based upon the one or more pressure readings to maintain a desired pressure within the electronic equipment enclosure with respect to an exterior of the electronic equipment enclosure, said first display and said second display are configured to present operating and alarm information, said first fan controller and said second fan controller are configured to communicate with one another.

2. The apparatus of claim 1 further comprising a communications processor configured to communicate through an electronic link with equipment outside the electronic equipment enclosure.

3. The apparatus of claim 2 wherein the communications processor is configured to relay operating and alarm information to a data center information management system.

4. The apparatus of claim 3 wherein the communications processor is configured to relay information related to an amount of time the first fan and the second fan have been operating.

5. The apparatus of claim 1 wherein said first fan controller and said second fan controller cooperates with one or more other fan controllers associated with the one or more other fan cartridges to operate all fans inserted within the chassis at substantially a same speed.

6. The apparatus of claim 5 wherein said first fan controller and said second fan controller are configured to adjust the speed of its associated fan upon receiving an indication that another fan inserted in the chassis has failed.

7. The apparatus of claim 1 wherein said first fan controller and said second fan controller are configured to perform a test by reducing speed of its associated fan.

8. The apparatus of claim 7 wherein said first fan controller and said second fan controller are configured to store and report sensor readings acquired during the test.

* * * * *